United States Patent
Datta

(10) Patent No.: US 10,187,084 B2
(45) Date of Patent: Jan. 22, 2019

(54) METHOD OF ENCODING DATA AND DATA STORAGE SYSTEM

(71) Applicant: NANYANG TECHNOLOGICAL UNIVERSITY, Singapore (SG)

(72) Inventor: Anwitaman Datta, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 15/510,216

(22) PCT Filed: Aug. 28, 2015

(86) PCT No.: PCT/SG2015/050284
§ 371 (c)(1),
(2) Date: Mar. 9, 2017

(87) PCT Pub. No.: WO2016/039686
PCT Pub. Date: Mar. 17, 2016

(65) Prior Publication Data
US 2017/0264317 A1  Sep. 14, 2017

(30) Foreign Application Priority Data
Sep. 10, 2014  (SG) .............................. 10201405607P

(51) Int. Cl.
*H03M 13/15* (2006.01)
*G06F 11/10* (2006.01)
(Continued)

(52) U.S. Cl.
CPC .......... *H03M 13/154* (2013.01); *G06F 3/065* (2013.01); *G06F 3/067* (2013.01); *G06F 3/0619* (2013.01);
(Continued)

(58) Field of Classification Search
CPC ............ H03M 13/154; H03M 13/3761; G06F 3/0619; G06F 3/065; G06F 3/067; G06F 11/1076
See application file for complete search history.

(56) References Cited

U.S. PATENT DOCUMENTS

| 2012/0023362 | A1 | 1/2012 | Kadhe et al. | |
|---|---|---|---|---|
| 2014/0152476 | A1* | 6/2014 | Oggier | H03M 13/373 341/94 |
| 2015/0006475 | A1* | 1/2015 | Guo | G06F 17/30159 707/609 |

OTHER PUBLICATIONS

Amazon Web Services, Inc., "Amazon Glacier Product Details," retrieved from https://aws.amazon.com/glacier/details/ on May 24, 2017, 5 pages.

(Continued)

*Primary Examiner* — Kyle Vallecillo
(74) *Attorney, Agent, or Firm* — Seed IP Law Group LLP

(57) ABSTRACT

According to various embodiments, there may be provided a method of encoding data, the method including providing a set of replica nodes, wherein each replica node of the set of replica nodes stores replica data identical to original data stored in a corresponding original node of a set of original nodes; receiving original data at each replica node of the set of replica nodes, wherein the received original data is transmitted from the corresponding original node of a different replica node; generating a first result at each replica node, based on the replica data stored therein and the received original data; and generating a second result at each replica node, based on the replica data stored therein and the first result from a different replica node; and replacing the replica data in each replica node with the second result from the respective replica node.

22 Claims, 5 Drawing Sheets

(51) Int. Cl.
H03M 13/37 (2006.01)
G06F 3/06 (2006.01)
H03M 13/23 (2006.01)
H03M 13/29 (2006.01)
G06F 11/20 (2006.01)

(52) U.S. Cl.
CPC ...... *G06F 11/1076* (2013.01); *H03M 13/3761* (2013.01); *G06F 11/2094* (2013.01); *H03M 13/23* (2013.01); *H03M 13/2936* (2013.01)

(56) References Cited

OTHER PUBLICATIONS

Amazon Web Services, Inc., "Amazon Simple Storage Service | Developer Guide, API Version Mar. 1, 2006," Amazon Web Services, Inc., 2017, 642 pages.
Apache Hadoop 3.0.0-aplpha2, "HDFS Architecture" retrieved from http://hadoop.apache.org/docs/current/hadoop-project-dist/hadoop-hdfs/ on May 24, 2017, 8 pages.
Bessani et al., "DepSky: Dependable and Secure Storage in a Cloud-of-Clouds," *Eurosys '11Proceesings of the sixth conference on Computer systems*:31-46, 2011, 15 pages.
Calder et al., "Windows Azure Storage: A Highly Available Cloud Storage Service with Strong Consistency," *SOSP '11*: 2011, 26 pages.
Datta et al., "Redundantly Grouped Cross-object Coding for Repairable Storage," *APSYS '12 Proceedings of the Asia-Pacific Workshop on Systems*: 2012, 6 pages.
Datta, "Locally Repairable RapidRAID Systematic Codes—One simple convoluted way to get it all," *Information Theory Workshop (ITW)*, 2014 IEEE:60-64, 2014.
Dimakis et al., "Network Coding for Distributed Storage Systems," *IEEE Transactions on Information Theory* 59(9):4539-4551, 2010.
Esmaili et al., "The CORE Storage Primitive: Cross-Object Redundancy for Efficient Data Repair & Access in Erasure Coded Storage," *ArXiv*: 2013, 14 pages.
Ford et al., "Availability in Globally Distributed Storage Systems," *Operating Systems Design and Implementation*: 2010, 14 pages.
Ghemawat et al., "The Google File System," *SOSP '03*: 2003, 15 pages.
Gopalan et al., "On the Locality of Codeword Symbols," *IEEE Transactions on Information Theory* 58:6925-6934, 2011.
Hadoop Wiki, "HDFS RAID," retrieved from http://wiki.apache.org/hadoop/HDFS-RAID, edited on Nov. 2, 2011, 5 pages.
Huang et al., "Erasure Coding in Windows Azure Storage," *Proceedings of the USENIX Annual Technical Conference*: 2012, 12 pages.
Huang et al., "Pyramid Codes: Flexible Schemes to Trade Space for Access Efficiency in Reliable Data Storage Systems," *ACM Transactions on Storage* 9(1): 2013, 28 pages.
IBM Cloud, "IBM Cloud Object Storage," retrieved from https://www.ibm.com/cloud-computing/products/storage/object-storage/, 2017, 8 pages.
Kermarrec et al., "Repairing Multiple Failures with Coordinated and Adaptive Regenerating Codes," *2011 International Symposium on Network Coding*: 2011, 15 pages.
Kubiatowicz et al., "OceanStore: An Architecture for Global-Scale Persistent Storage," *Proc. ASPLOS*: 2000, 12 pages.
Li et al., "CORE: Augmenting Regenerating-Coding-Based Recovery for Single and Concurrent Failures in Distributed Storage Systems," *2013 IEEE 29th Symposium on Mass Storage Systems and Technologies (MSST)*: 2013, 6 pages.
Lin et al., "A Decentralized Repair Mechanism for Decentralized Erasure Code based Storage Systems," *TRUSTCOM '11 Proceedings of the 2011IEEE 10th International Conference on Trust, Security and Privacy in Computing and Communications*:613-620, 2011.
MacKay, *Information Theory, Inference, and Leaning Algorithms*, Cambridge University Press, Cambridge, United Kingdom, fourth printing, 2005, 640 pages.
Oggier et al., "Coding Techniques for Repairability in Networked Distributed Storage Systems," *Foundations and Trends in Communications and Information Theory*, 9(4), 2012, 96 pages.
Oggier et al., "Self-Repairing Codes for Distributed Storage—A Projective Geometric Construction," *2011 IEEE Information Theory Workshop*: 2011, 5 pages.
Oggier et al., "Self-repairing Homomorphic Codes for Distributed Storage Systems," *2011Proceedings IEEE INFOCOM*: 2011, 10 Pages.
Pamies-Juarez et al., "Decentralized Erasure Coding for Efficient Data Archival in Distributed Storage Systems," *ICDCN 2013: Distributed Computing and Networking*:42-56, 2013.
Pamies-Juarez et al., "In-Network Redundancy Generation for Opportunistic Speedup of Data Backup," *Future Generation Computer Systems 29*: 2013, 20 pages.
Pamies-Juarez et al., "RapidRAID: Pipelined Erasure Codes for Fast Data Archival in Distributed Storage Systems," *arXiv:1207.6744v2*: 2012, 9 pages.
Papailiopoulos et al., "Locally Repairable Codes," *IEEE Transactions on Information Theory* 60(10): 2014, 19 pages.
Papailiopoulos et al., "Storage Codes with Optimal Repair Locality," *Proceedings of the IEEE Intl. Symposium on Information Theory (ISIT)*: 2012, 9 pages.
Rashmi et al., "Explicit Construction of Optimal Exact Regenerating Codes for Distributed Storage," *Allerton'09 Proceedings of the 47th annual Allerton Conference on Communication, Control, and Computing*:1243-1249, 2009.
Rawat et al., "On Locality in Distributed Storage Systems," *2012 IEEE Information Theory Workshop*: 2012, 5 pages.
Rawat et al., "Optimal Locally Repairable and Secure Codes for Distributed Storage Systems," *IEEE Transactions on Information Theory* 60(1):212-236, 2013.
Reed et al., "Polynomial Codes Over Certain Finite Fields," *J. Soc. Ind. Appl. Math.* 8:300-304, 1960, 2 pages.
Shum, "Cooperative Regenerating Codes for Distributed Storage Systems," *IEEE ICC 2011 proceedings*: 2011, 5 pages.
Thusoo et al., "Data Warehousing and Analytics Infrastructure at Facebook," *SIGMOD '10 Proceedings of the 2010 ACM SIGMOD International Conference on Management of data*:1013-1020, 2010.
Wu, "Existence and Construction of Capacity-Achieving Network Codes for Distributed Storage," IEEE Journal on Selected Areas in Communications 28(2):277-288, 2010.

* cited by examiner

US 10,187,084 B2

METHOD OF ENCODING DATA AND DATA STORAGE SYSTEM

CROSS-REFERENCE TO RELATED APPLICATIONS

This application claims the benefit of Singapore Patent Application number 10201405607P filed 10 Sep. 2014, the entire contents of which are incorporated herein by reference for all purposes.

TECHNICAL FIELD

The present invention relates to methods of encoding data and data storage systems.

BACKGROUND

Distributed data stores, or in other words, storages, are deployed for the storage of huge volumes of data. Since such large-scale systems may be prone to frequent failure of individual components, they generally require redundancy at different levels to achieve fault-tolerance. At the data layer, redundancy may be achieved using either replication, or alternatively by employing error or erasure correcting codes. With the growing volume of data, the cost factors arising from storage overheads to realize redundancy are accentuated and therefore, one of the design objectives for a data storage system or its corresponding method of encoding data is to reduce storage overheads.

A vigorously studied problem is that of repairing erasure coded data. When a storage node storing an encoded piece fails permanently, it is desirable to recreate anew the corresponding information at a live node, so that the system remains resilient over time. A naive strategy to replenish redundancy may be to decode and re-encode, but this is expensive, particularly in terms of the usage of network resources. Regenerating codes which optimize the bandwidth usage for repairs may address this issue, but regenerating codes requires contacting many live nodes, which contradicts another design objective which is to reduce the number of live nodes to be contacted in order to carry out repairs. Reducing the number of live nodes to be contacted for carrying out repairs may lead to a reduction in repair bandwidth usage, better degraded reads, faster repairs, less number of input/output (I/O) operations, ability to repair multiple failures simultaneously, etc.

Therefore, there is a need for a method of encoding data that is able to achieve local repairability, in other words, a lesser number of surviving nodes is required to restore a lost data block, and fast creation of erasure coded data, using a single code.

SUMMARY

According to various embodiments, there may be provided a method of encoding data, the method including providing a set of replica nodes, wherein each replica node of the set of replica nodes stores replica data identical to original data stored in a corresponding original node of a set of original nodes; receiving original data at each replica node of the set of replica nodes, wherein the received original data is transmitted from the corresponding original node of a different replica node; generating a first result at each replica node, based on the replica data stored therein and the received original data; and generating a second result at each replica node, based on the replica data stored therein and the first result from a different replica node; and replacing the replica data in each replica node with the second result from the respective replica node.

According to various embodiments, there may be provided a data storage system including a set of replica nodes, wherein each replica node of the set of replica nodes stores replica data identical to original data stored in a corresponding original node of a set of original nodes; each replica node of the set of replica nodes configured to receive original data, wherein the received original data is transmitted from the corresponding original node of a different replica node; an encoder circuit configured to generate a first result at each replica node, based on the replica data stored therein and the received original data; wherein the encoder circuit is further configured to generate a second result at each replica node, based on the replica data stored therein and the first result from a different replica node; and wherein the encoder circuit is further configured to replace the replica data in each replica node with the second result from the respective replica node.

According to various embodiments, there may be provided a non-transitory machine readable medium having stored therein a plurality of programming instructions, which when executed, cause a machine to provide a set of replica nodes, wherein each replica node of the set of replica nodes stores replica data identical to original data stored in a corresponding original node of a set of original nodes; receive original data at each replica node of the set of replica nodes, wherein the received original data is transmitted from the corresponding original node of a different replica node; generate a first result at each replica node, based on the replica data stored therein and the received original data; and generate a second result at each replica node, based on the replica data stored therein and the first result from a different replica node; and replace the replica data in each replica node with the second result from the respective replica node.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
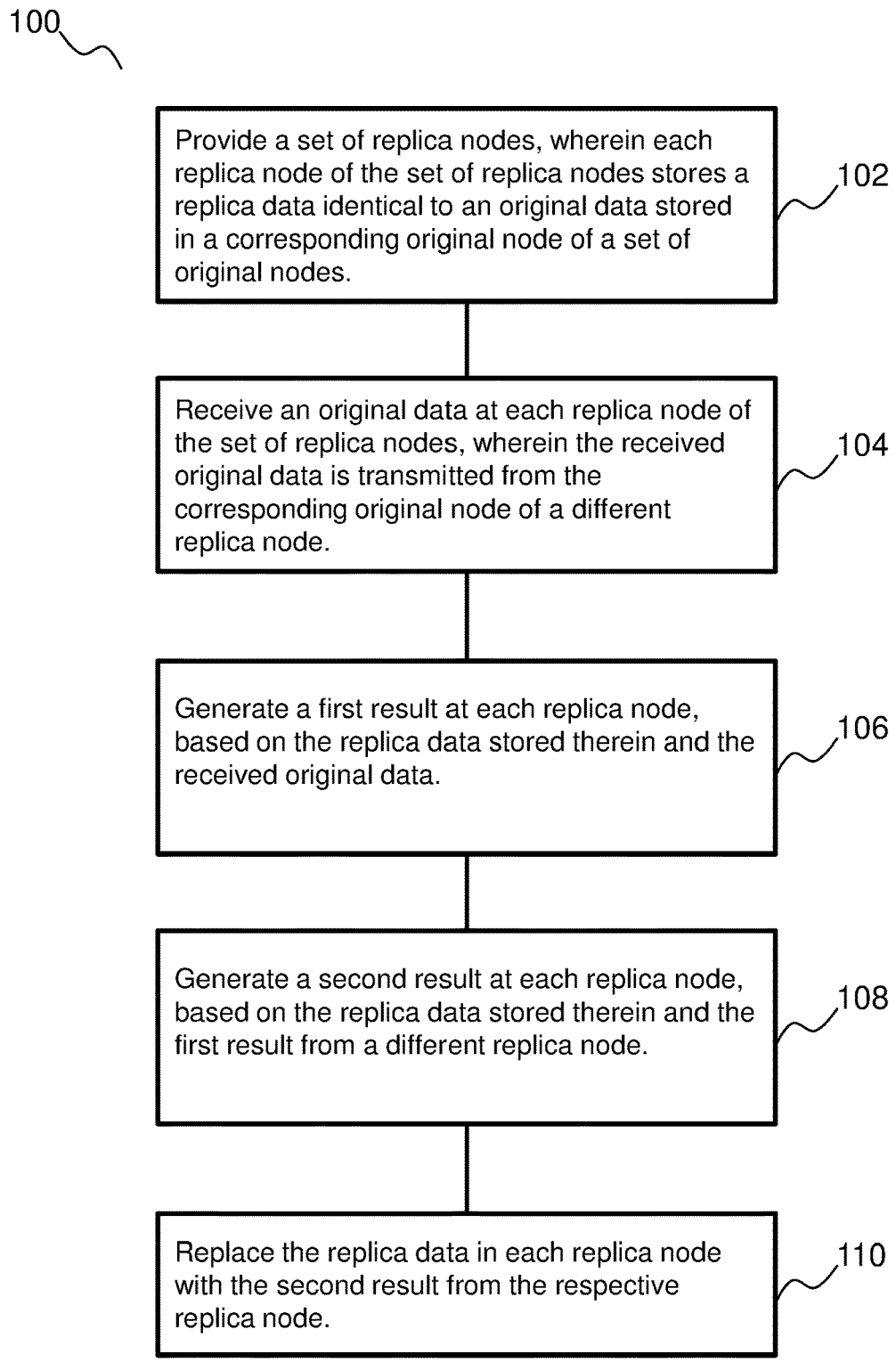
FIG. 1 shows a flow diagram of a method of encoding data in accordance to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

In this context, the data storage system as described in this description may include a memory which is for example used in the processing carried out in the data storage system. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Distributed data stores, in other words, storages, are deployed for the storage of huge volumes of data. Since such large-scale systems may be prone to frequent failure of individual components, they generally require redundancy at different levels to achieve fault-tolerance. At the data layer, redundancy may be achieved using either replication, or alternatively by employing error or erasure correcting codes. With the growing volume of data, the cost factors arising from storage overheads to realize redundancy are accentuated and therefore, one of the design objectives for a data storage system or its corresponding method of encoding data is to reduce storage overheads.

A vigorously studied problem is that of repairing erasure coded data. When a storage node storing an encoded piece fails permanently, it is desirable to recreate anew the corresponding information at a live node, so that the system remains resilient over time. A naive strategy to replenish redundancy may be to decode and re-encode, but this is expensive, particularly in terms of the usage of network resources. Regenerating codes which optimize the bandwidth usage for repairs may address this issue, but regenerating codes requires contacting many live nodes, which contradicts another design objective which is to reduce the number of live nodes to be contacted in order to carry out repairs. Reducing the number of live nodes to be contacted for carrying out repairs may lead to a reduction in repair bandwidth usage, better degraded reads, faster repairs, less number of input/output (I/O) operations, ability to repair multiple failures simultaneously, etc.

Therefore, there is a need for a method of encoding data that is able to achieve local repairability, in other words, a lesser number of surviving nodes is required to restore a lost data block, and fast creation of erasure coded data, using a single code.

A method of encoding data, according to various embodiments, may implement an erasure code. The method may be used to realize redundancy of the data layer of a data storage system. The method may implement a storage code that is repairable, in other words, the storage code may allow rebuilding of data at a new storage node for substituting a loss of information when an existing node of the data storage system fails. The method of encoding data may include performing convolutional coding. The method of encoding data may include performing distributed coding, in other words, the process of encoding data may be distributed across a plurality of data storage nodes of a data storage system. The method may have the advantage of fast redundancy creation because its encoding process is distributed across the nodes.

A method of encoding data, according to various embodiments, may achieve at least one property of a plurality of desirable properties, the plurality of desirable properties including local repairability, multiple erasure tolerance, quick redundancy creation process, low overhead storage and systematic coding. The method of encoding data may also achieve all of the abovementioned desirable properties, using a single coding scheme. The method may create coded data from existing replicas of the data to be coded. The created coded data may be erasure coded data.

A method of encoding data, according to various embodiments, may include distributing the process of encoding data across network resources of a data storage system. The method may include creation of erasure coded data from existing replicas in the data storage system. The method may accelerate a process of creating redundancy of data in the data storage system. The method may use network resources of a data storage system to carry out various data processing steps in a distributed manner. The various data processing steps may include encoding, decoding, etc. Decoding may refer to the regeneration of lost data, for recovering the system from a failure. The method may use the computational resources within the storage network and possible prior replication-based redundancy in a data storage system to distribute and accelerate the encoding process. The data storage system may have data already present in replicated form. The method may use this data in the replicated form to distribute the coding process. The data storage system may also have data newly arriving in the system, akin to pipelined creation of replicas. The method may utilize the storage network resources to carry out the encoding and reduce the load at the source node which is introducing the data to the system. By doing so, the method may improve the throughput of populating the system with erasure coded redundancy of the newly arrived data. The method may also improve the throughput of data insertion.

A method of encoding data, according to various embodiments, may generate coded data having more than one of a plurality of desirable repairability properties. The desirable reparability properties may include a reduced volume of input/output operations; minimized bandwidth usage; fast repairs; locally repairable codes; simultaneous repairing of multiple failures, etc. Locally repairable codes may refer to codes where encoded fragments may be repaired directly from other small subsets of encoded fragments. Locally repairable codes may also only need to contact a minimal number of live nodes in order to carry out repairs, or in other words, a lost data block may be recovered based on data from a small number of surviving nodes. Locally repairable code may enable a fragment to be repaired from a fixed number of encoded fragments, independently of which specific blocks are missing.

A method of encoding data, according to various embodiments, may have a better local repairability as compared to other classical erasure codes, as a lesser number of surviving nodes may be required to restore a lost data block.

A method of encoding data, according to various embodiments, may be a computer-implemented method. The method may be simple in construction, and therefore, easy to implement.

A method of encoding data, according to various embodiments, may include carrying out a single coding scheme. The method may include carrying out convolutional coding. The single coding scheme may be convolutional coding. The convolutional coding scheme may be a tail-biting convolutional coding scheme, in other words, the convolutional coding scheme may start and end at a same data node of a data storage system. Convolutional coding may be viewed as processing an input stream over a shift register with possible linear feedback, leading to linear output functions. The method may leverage on intrinsic structural properties of a convolutional code for realizing the desirable properties in distributed storage systems. The method may generate convolutional codes. The generated convolutional codes may have a code rate of ½. The method may further include an additional coding scheme, for example, Reed-Solomon coding.

A method of encoding data, according to various embodiments, may include generating a concatenated code including an outer code and an inner code. The outer code may be Reed-Solomon coding. The inner code may be convolutional code.

A method of encoding data, according to various embodiments, may generate a systematic code. A systematic code may be any error-correcting code in which an input data is embedded in the encoded output. The code rate achieved by the method of encoding data may be ½. Code rate refers to the proportion of a data-stream that is non-redundant. The method may encode k input symbols into 2k output symbols, where k represents a quantity. The code generated by the method may have a Hamming distance of four and therefore be capable of tolerating up to three erasures, which is often adequate in the relatively stable data-center environments. The code rate may be adapted to achieve code rates of more than 0.5, for example, in the range of 0.6-0.8. The code rate may be increased by puncturing the encoded data. The encoded data may be punctured, to omit some encoded bits of the encoded data. In other words, it may be understood that puncturing refers to the process of removing some parity bits after encoding with an error-correction code.

A method of encoding data, according to various embodiments, may be implemented as a plurality of programming instructions stored in a non-transitory machine readable medium, which when executed, causes a machine to perform the method of encoding data. The plurality of programming instructions may have a simple and explicit construction. The plurality of instructions may be easy to implement and easy to integrate. The implementation of the method as plurality of programming instructions may be low in computational complexity. The method may offer a simple and mature solution for data storage practitioners.

A data storage system, according to various embodiments, may have its data stored therein encoded. The data storage system may include a plurality of data stores, or referred herein as data nodes or data storage nodes. The plurality of data stores may be distributed so as to enable scaling out of the data storage system.

A method of encoding data, according to various embodiments, may leverage on existing replicas of data in a data storage system to carry out a distributed coding process. In a data storage system, the data to be encoded may already be present in the system in the replicated form. Often in practice, when the data is freshly acquired in the system, it may be replicated not only for fault tolerance, but also because the data is hot, in other words, being used and manipulated by various applications, so having multiple copies provide flexibility in terms of load balancing. Subsequently, once the data becomes cold, and is used infrequently, it may become desirable to archive the data using erasure coding, in order to achieve fault tolerant and durable storage while keeping the overheads low. This may lead to a significant acceleration of the overall coding process. Convolution codes or tail-biting convolution codes may be naturally amenable to convert replicated data into erasure coded redundancy.

FIG. 1 shows a flow diagram 100 showing a method of encoding data, in accordance to various embodiments. In 102, a set of replica nodes may be provided, wherein each replica node of the set of replica nodes may store replica data identical to original data stored in a corresponding original node of a set of original nodes. In 104, original data may be received at each replica node of the set of replica nodes, wherein the received original data may be transmitted from the corresponding original node of a different replica node. In 106, a first result may be generated at each replica node, based on the replica data stored therein and the received original data. In 108, a second result may be generated at each replica node, based on the replica data stored therein and the first result from a different replica node. In 110, the replica data in each replica node may be replaced with the second result from the respective replica node.

In other words, according to various embodiments, a method of encoding data may include providing a set of replica nodes (102), receiving original data at each replica node of the set of replica nodes (104), generating a first result at each replica node (106), generating a second result at each replica node (108) and replacing the replica data in each replica node with the second result (110). In 102, each replica node of the set of replica nodes may store replica data. The replica data stored in each replica node may be identical to original data stored in a corresponding original node of a set of original nodes. The number of replica nodes may be equal to the number of the original nodes. In 104, the received original data may be transmitted from the corresponding original node of a different replica node, in other words, the received original data may be transmitted from an original node that corresponds to another replica node. In 106, the first result may be generated at each replica node, based on the replica data stored in the respective replica node, as well as based on the original data received in 104. In 108, the second result may be generated at each replica node, based on the replica data stored in the respective replica node, as well as based on the first result of another replica node. In 110, the replica data in each replica node may be replaced with the second result generated at the respective replica node.

According to various embodiments, providing a set of replica nodes (102) may include replicating the original data stored in each original node of the set of original nodes. Providing a set of replica nodes (102) may further include storing the replicated data in the set of replica nodes. The number of the replica nodes may equal the number of the original nodes.

According to various embodiments, receiving original data at each replica node of the set of replica nodes (104) may include receiving the original data from an original node that the respective replica node is bijectively paired with. Receiving original data at each replica node of the set of replica nodes (104) may include receiving the original data from an original node that is at least one of immediately succeeding the corresponding original node of the respective replica node, or immediately preceding the corresponding original node of the respective replica node. Receiving original data at each replica node of the set of replica nodes (104) may include receiving the original data from an original node that is a fixed number of original nodes away from the corresponding original node of the respective replica node.

According to various embodiments, generating a first result at each replica node (106) may include a linear operation. Generating a first result at each replica node (106) may include performing an addition. Generating a first result at each replica node (106) may include performing an XOR logical operation.

According to various embodiments, generating a second result at each replica node (108) may include generating the second result at the respective replica node based on the replica data stored therein and the first result from a replica node that is one replica node away from the respective replica node. Generating a second result at each replica node (108) may include a linear operation. Generating a second result at each replica node (108) may include performing an addition. Generating a second result at each replica node (108) may include performing an XOR logical operation.

According to various embodiments, at least one of the set of original nodes or the set of replica nodes may be an ordered set having a cyclic order. An original node immediately succeeding a last original node may be a first original node while an original node immediately preceding a first original node may be a last original node. A replica node immediately succeeding a last replica node may be a first replica node while a replica node immediately preceding a first replica node may be a last replica node.

The method of encoding data, according to various embodiments, may be pipelined. Generating a first result (106) at a second replica node and generating a second result (108) at a first replica node may occur simultaneously.

The method of encoding data, according to various embodiments, may be a computer-implemented method.

In accordance to various embodiments, a plurality of programming instructions may be stored in a non-transitory machine readable medium and the plurality of programming instructions, when executed, may cause a machine to execute the method of FIG. 1. In other words, there may be provided a non-transitory machine readable medium having stored therein a plurality of programming instructions. The execution of the plurality of programming instruction may cause a machine to provide a set of replica nodes, wherein each replica node of the set of replica nodes stores replica data identical to original data stored in a corresponding original node of a set of original nodes; receive original data at each replica node of the set of replica nodes, wherein the received original data is transmitted from the corresponding original node of a different replica node; generate a first result at each replica node, based on the replica data stored therein and the received original data; and generate a second result at each replica node, based on the replica data stored therein and the first result from a different replica node; and replace the replica data in each replica node with the second result from the respective replica node.

Figure 2:
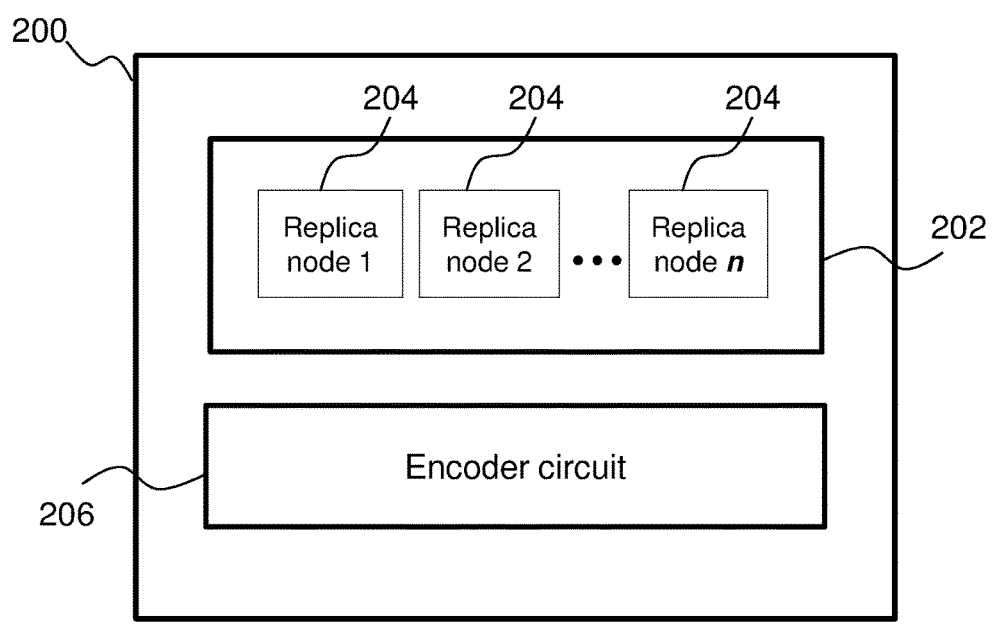
FIG. 2 shows a conceptual diagram of a data storage system in accordance to various embodiments.

FIG. 2 shows a conceptual diagram of a data storage system 200, in accordance to various embodiments. The data storage system 200 may include a set of replica nodes 202, wherein each replica node 204 of the set of replica nodes 202 may store replica data identical to original data stored in a corresponding original node of a set of original nodes. Each replica node 204 of the set of replica nodes 202 may be configured to receive original data, wherein the received original data is transmitted from the corresponding original node of a different replica node 204. The data storage system 200 may further include an encoder circuit 206 which may be configured to generate a first result at each replica node 204, based on the replica data stored therein and the received original data. The encoder circuit 206 may be further configured to generate a second result at each replica node 204, based on the replica data stored therein and the first result from a different replica node 204. The encoder circuit 206 may be further configured to replace the replica data in each replica node 204 with the second result from the respective replica node 204.

Figure 3:
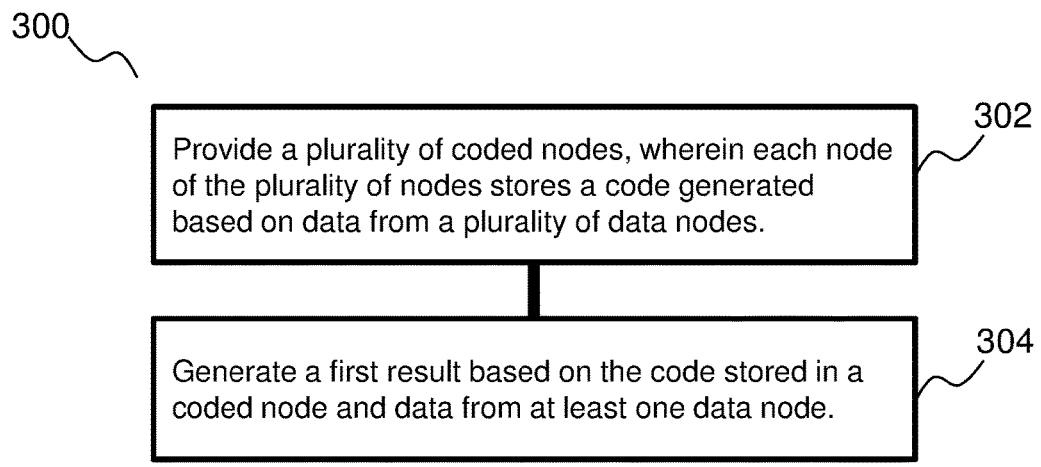
FIG. 3 shows a flow diagram of a method of decoding data in accordance to various embodiments.

FIG. 3 shows a flow diagram 300 showing a method of decoding data, according to various embodiments. In 302, a plurality of coded nodes may be provided, wherein each node of the plurality of nodes may store a code generated based on data from a plurality of data nodes. In 304, a first result may be generated, based on the code stored in a coded node and data from at least one data node.

Figure 4:
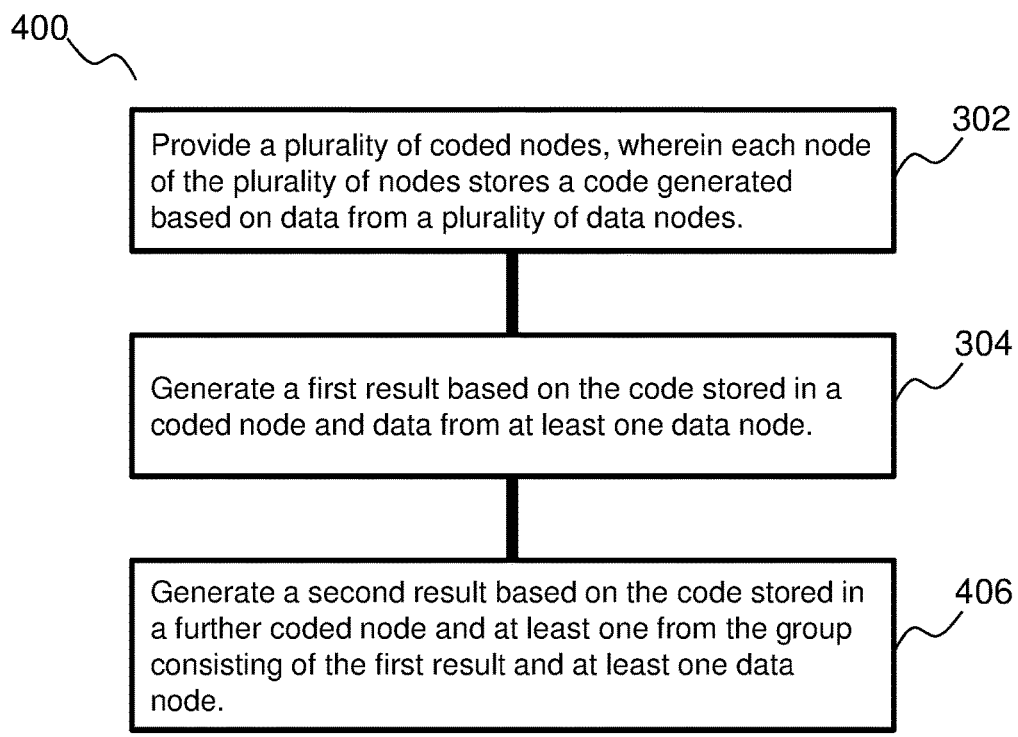
FIG. 4 shows a flow diagram of a method of decoding data in accordance to various embodiments.

FIG. 4 shows a flow diagram 400 showing a method of decoding data, according to various embodiments. In 302, a plurality of coded nodes may be provided, wherein each node of the plurality of nodes may store a code generated based on data from a plurality of data nodes. In 304, a first result may be generated, based on the code stored in a coded node and data from at least one data node. The method of FIG. 4 is similar to the method of FIG. 3, in that it includes 302 and 304. In addition to the method of FIG. 3, the method of FIG. 4 may include 406, in which a second result may be generated based on the code stored in a further coded node and at least one from the group consisting of the first result and at least one data node.

In the following paragraphs, methods of encoding data, in accordance to various embodiments, are described using examples.

Figure 5:
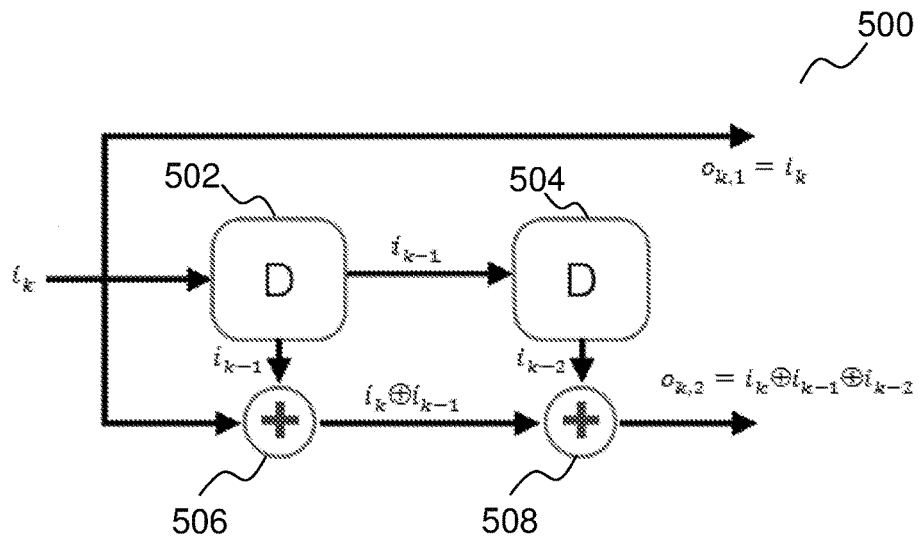
FIG. 5 shows an encoder in accordance to various embodiments.

FIG. 5 shows an encoder 500 relating to a first example. The first example is also referred to herein as Example 1. The encoder 500 may be a rate-½ binary systematic linear convolution encoder. The encoder 500 may include a first shift register 502 and a second shift register 504. The first shift register 502 and the second shift register 504 may be initialized with a zero bit. The first shift register 502 may be configured to receive an input data stream and further configured to introduce a delay to the input data stream to provide a delayed data stream. The second shift register 504 may be configured to receive the delayed data stream of the first shift register and further configured to introduce a further delay to provide a further delayed data stream. The encoder 500 may further include a first operator 506 and a second operator 508, each of the first operator 506 and the second operator 508 may be configured to perform a linear operation. The linear operation may be an addition. The linear operation may be a bit XOR operation, in other words, an exclusive OR operation. The linear operation may not introduce any delays to data streams. In this example, the linear operation is assumed to be a XOR operation. The first operator 506 may be configured to provide a first result based on performing an XOR operation on the input data stream and the delayed data stream. The second operator 508 may be configured to provide a second result based on performing an XOR operation on the first result and the further delayed data stream.

A method of encoding, according to various embodiments, as explained using Example 1 of FIG. 5 is described in this paragraph. An input data stream, with data bit $i_k$ arriving at time k, may be first duplicated into three copies. A first copy of data bit $i_k$ may be passed to a first output generator to form a first output bit, $o_{k,1}=i_k$. A second copy of data bit $i_k$ may be received by the first shift register 502 which then generates a delayed data bit $i_{k-1}$. A third copy of data bit $i_k$ may be received by the first operator 506 which may also receive the delayed data bit $i_{k-1}$. The first operator 506 may generate a first result based on the data bit $i_k$ and the delayed data bit $i_{k-1}$, the first result being $i_k \oplus i_{k-1}$. The second shift register may receive the delayed data bit $i_{k-1}$ and may generate a further delayed data bit $i_{k-2}$. The second operator 508 may generate a second result based on the further delayed data bit $i_{k-2}$ and the first result $i_k \oplus i_{k-1}$, the second result being $i_k \oplus i_{k-1} \oplus i_{k-2}$. The second result may form a second output bit, $o_{k,2}=i_k \oplus i_{k-1} \oplus i_{k-2}$. In other words, the encoder 500 may encode a single-bit input, $i_k$, into a two-bit encoded output, $\langle o_{k,1}, o_{k,2} \rangle$, using the method of encoding. The two-bit output may be $\langle o_{k,1}, o_{k,2} \rangle = \langle i_k, i_{k-2} \oplus i_{k-1} \oplus i_k \rangle$. As the input bit $i_k$ is also present as one of the output bits, the coding scheme may be described as a systematic code. As the encoded two-bit output includes one redundant bit out of its two bits of data, the coding scheme may have a rate of ½.

In the context of a distributed storage system, or herein also referred to as a data storage system, a finite number of storage nodes may be populated with a finite amount of data by employing a tail-biting code, which essentially has a warping effect. A method of encoding, employing a tail-biting code, will be described in the following paragraphs.

A first definition, also referred to herein as definition 1, may be as follows: a row matrix u may be transformed to produce n=2k output symbols v according to a mapping produced by the matrix multiplication, v=uG. The row matrix u may represent k input symbols $u_1, u_2, u_k$. In a systematic representation, a generator matrix G may be $G=[I_k|A_k]$, where $I_k$ may be a k×k identity matrix and $A_k$ may be a k×k matrix. In $A_k$, the $i^{th}$ column may have the element 1 in rows i−1(mod k)+1, i(mod k)+1 and i+1(mod k)+1, while all other elements may be zeroes. This transformation may result in n=2k output symbols. This may be a rate ½ tail-biting convolution code corresponding to the code from Example 1 as the base.

Definition 1 may be explained, using an example of a generator matrix for k=5. This example is referred to herein as the second example, also referred to herein as Example 2. For k=5, the input symbols may be expressed as a row matrix u having 5 elements, such that $u=[u_1\ u_2\ u_3\ u_4\ u_5]$. A method of encoding may include generating output symbols v, using the mapping of v=uG. For k=5, $$I_k = \begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix} \text{ and } A_k = \begin{bmatrix} 1 & 0 & 0 & 1 & 1 \\ 1 & 1 & 0 & 0 & 0 \\ 1 & 1 & 1 & 0 & 0 \\ 0 & 1 & 1 & 1 & 0 \\ 0 & 0 & 1 & 1 & 1 \end{bmatrix}.$$

$$\text{Therefore, } G = [I_k | A_k] = \begin{bmatrix} 1 & 0 & 0 & 0 & 0 & 1 & 0 & 0 & 1 & 1 \\ 0 & 1 & 0 & 0 & 0 & 1 & 1 & 0 & 0 & 1 \\ 0 & 0 & 1 & 0 & 0 & 1 & 1 & 1 & 0 & 0 \\ 0 & 0 & 0 & 1 & 0 & 0 & 1 & 1 & 1 & 0 \\ 0 & 0 & 0 & 0 & 1 & 0 & 0 & 1 & 1 & 1 \end{bmatrix}$$

Output symbols v =

$$uG = [u_1\ u_2\ u_3\ u_4\ u_5] \times \begin{bmatrix} 1 & 0 & 0 & 0 & 0 & 1 & 0 & 0 & 1 & 1 \\ 0 & 1 & 0 & 0 & 0 & 1 & 1 & 0 & 0 & 1 \\ 0 & 0 & 1 & 0 & 0 & 1 & 1 & 1 & 0 & 0 \\ 0 & 0 & 0 & 1 & 0 & 0 & 1 & 1 & 1 & 0 \\ 0 & 0 & 0 & 0 & 1 & 0 & 0 & 1 & 1 & 1 \end{bmatrix} =$$

$$[u_1\ u_2\ u_3\ u_4\ u_5\ u_1+u_2+u_3\ u_2+u_3+$$
$$u_4\ u_3+u_4+u_5\ u_1+u_4+u_5\ u_1+_2+u_5]$$

Figure 6:
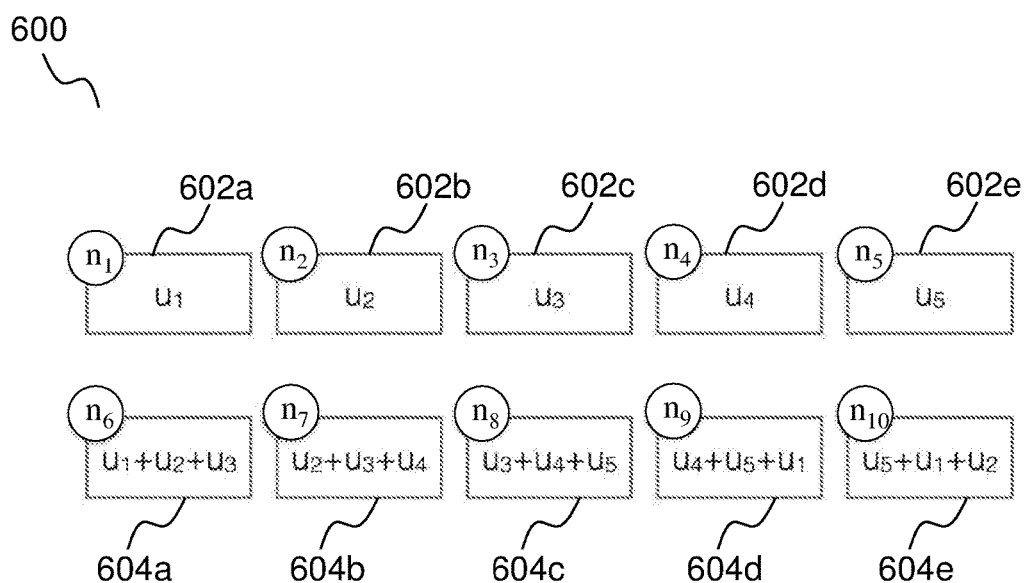
FIG. 6 shows a data storage system in accordance to various embodiments.

FIG. 6 shows a diagram showing an example of a data storage system 600. The data storage system 600 may include ten storage nodes. The data storage system may have encoded data stored therein and the encoded data may be encoded using a tail-biting convolution code. The ten storage nodes may include a set of original nodes 602a-602e and a set of replica nodes 604a-604e. Similar to Example 2, the quantity of input symbols is k=5. Each node of the ten storage nodes may have a respective output symbol stored therein, the respective output symbol being a respective element from the following definition from Example 2:

$v=[u_1\ u_2\ u_3\ u_4\ u_5\ u_1+u_2+u_3\ u_2+u_3+u_4\ u_3+u_4+u_5$
$u_1+u_4+u_5\ u_1+u_2+u_5]$

This code family may have a minimum distance of four, and hence, up to three arbitrary failures, or in other words, erasures, may be tolerated without loss of any data. For the example with k=5 and n=10, some specific scenarios of four or five failures may not lead to data loss, while other scenarios may, and more than five failures leads to certain data loss. The parity created by the convolution of three symbols may be exploited for local repairs.

Figure 7A:
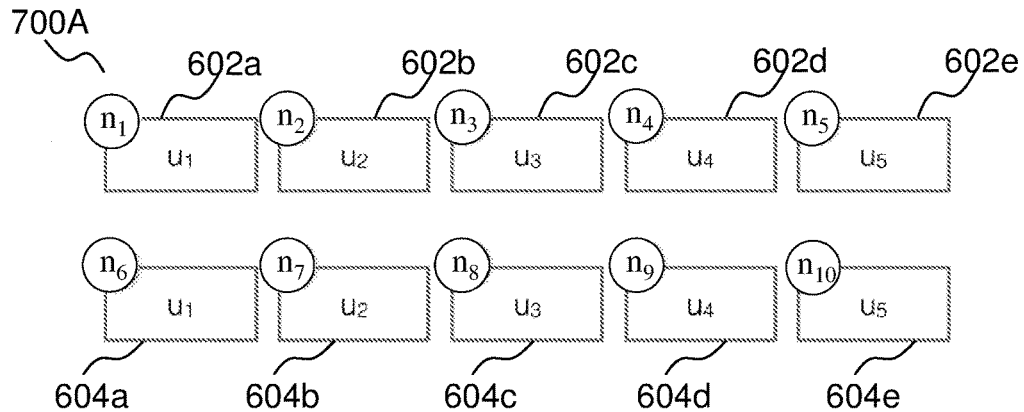
FIG. 7A shows an initial set up of a data storage system in accordance to various embodiments.
Figure 7B:
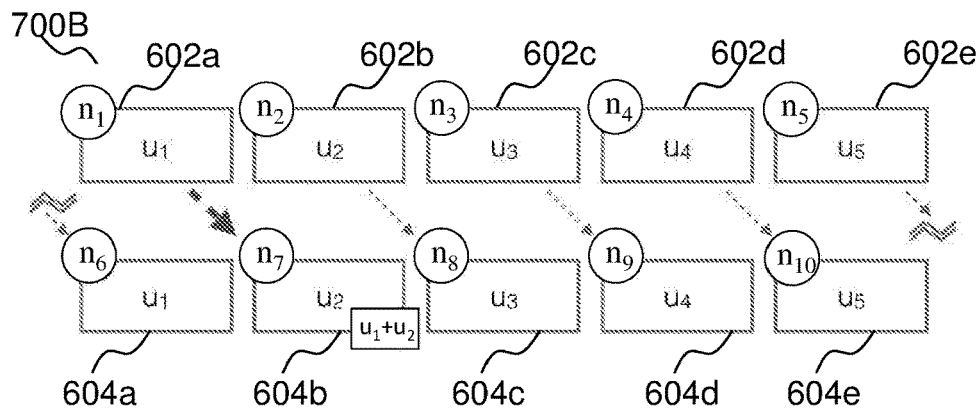
FIG. 7B shows a step in a method of encoding data, in accordance to various embodiments.
Figure 7C:
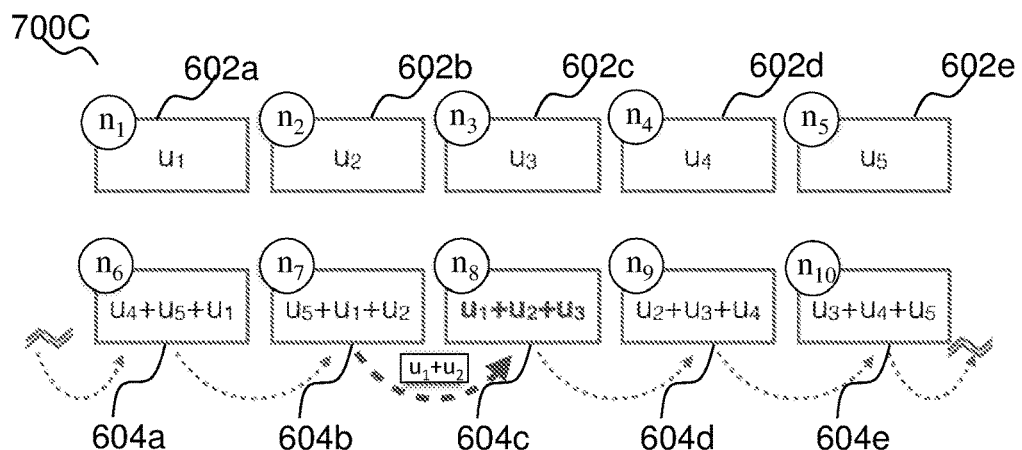
FIG. 7C shows a step in a method of encoding data, in accordance to various embodiments.

FIGS. 7A-7C show diagrams 700A, 700B and 700C, each of which shows a step in a method of encoding data, according to various embodiments. The method may transform an existing replication based redundancy into erasure coded redundancy. The end result of the coding process, as shown in FIG. 7C, may be the same data and parity allocation as in FIG. 6, once the arrangement of the node positions in the second row is discounted for. While FIGS. 7A-7C the method of encoding data, for k=5 and n=10, where k denotes a number of data bits and n denotes a total number of nodes, the method may be applied for any other values of k and n.

FIG. 7A shows a diagram 700A showing an initial set up of the data storage system of FIG. 6. The data storage system may include a set of original nodes 602a-602e and a set of replica nodes 604a-604e. Each node of the set of original nodes 602a-602e may store original data. The plurality of original data may be denoted as a row matrix, $u=[u_1\ u_2\ u_3\ u_4\ u_5]$, where each original data may be an element from the row matrix u. The set of replica nodes 604a-604a may correspond to the set of original nodes 602a-602e such that each replica node of the set of replica nodes may correspond to a respective original node of the set of original nodes. In other words, replica node 604a may correspond to original node 602a, replica node 604b may correspond to original node 602b, replica node 604c may correspond to original node 602c, replica node 604d may correspond to original node 602d and replica node 604e may correspond to original node 602e. Each node of the set of replica nodes 604a-604e may store replica data identical to the original data of its corresponding original node. The set of replica nodes 604a-604e having stored therein a respective replica data, may be provided within the data storage system as part of an initial set-up, or may be provided through a replication process. The replication process may include replicating the original data stored in each original node of the set of original nodes, and may further include storing the replicated data in the set of replica nodes 604a-604e.

FIG. 7B shows a diagram 700B showing a first logical step, herein also referred to as Step-1, in a method of encoding data, according to various embodiments. Step-1 is described herein, using the data storage set-up of FIG. 7A as an example. In Step-1, each original node of the set of original nodes 602a-602e may send a copy of data stored therein to a replica node which is different from a corresponding replica node of the respective original node. In other words, an original node having stored therein a copy of data $u_i$ may send a copy of data $u_i$ to any replica node holding a replica of data $u_{i'}$, where i'≠i. For example, original node 602a may send a copy of $u_1$ to any one of replica nodes 604b-604e. Each replica node of the set of replica nodes 604a-604e may receive the original data transmitted from the corresponding original node of a different replica node. For example, replica node 604a may receive original data from any one of original nodes 602b-602e, but may not receive original data from original node 602a. Each replica node may be bijectively paired with an original node, for receiving original data, in other words, if replica node 604b is bijectively paired with original node 602a, then replica node 604b may receive original data $u_1$ from original node 602a. Each replica node may be bijectively paired with an original node that is immediately succeeding the corresponding original node of the respective replica node, for example, replica node 604b may be bijectively paired with original node 602c. Each replica node may be bijectively paired with an original node that is immediately preceding the corresponding original node of the respective replica node, for example, replica node 604b may be bijectively paired with original node 602a. Alternatively, each replica node may receive original data from an original node that is a fixed number of original nodes away from the corresponding original node of the respective replica node, for example, if the fixed number is 2, replica node 604a may receive original data from original node 602c while replica node 604b may receive original data from original node 602d. In the example shown in FIG. 7B, original nodes holding a copy of data $u_i$ may send the copy of data $u_i$ to a replica node holding a replica of data $u_i(\bmod k)+1$. In other words, the set of original nodes 602a-602e may be an ordered set having a cyclic order. In the cyclic ordered set of original nodes, the original node that immediately succeeds a last original node may be the first original node, and the original node that immediately precedes a first original node may be the last original node. The set of replica nodes 604a-604e may also be an ordered set having a cyclic order. In the cyclic ordered set of replica nodes, the replica node that immediately succeeds a last replica node may be the first replica node, and the replica node that immediately precedes a first replica node may be the last replica node.

At each replica node, a first result may be generated based on the replica data stored therein and the received original data. For example, for the case of FIG. 7B, replica node 604b may receive original data $u_1$ from original node 602a and may thus generate a first result based on $u_1$, the received original data and $u_2$, the replica data stored in replica node 604b. Generation of the first result may include a linear operation. Generation of the first result may include an addition. Generation of the first result may also include a XOR logical operation. If tail-biting convolution code is used, or if the set of replica nodes and the set of original nodes are ordered cyclic sets, the first result generated may be generalized as $u_i+u_i(\bmod k)+1$, if each replica node receives original data from the corresponding original node of a replica node immediately preceding the respective replica node.

FIG. 7C shows a second logical step, herein also referred to as Step-2, of a method of encoding data, according to various embodiments. In Step-2, each replica node may send the first result generated therein, to a different replica node, or in other words, any replica node other than itself. In the example shown in FIG. 7C, each replica node may send the first result generated therein to a replica node that is one replica node away from the respective node. A second result may be generated at each replica node, based on the replica data stored therein and the first result received from a different replica node. Generation of the second result may include a linear operation. Generation of the second result may include an addition. Generation of the second result may also include a XOR logical operation. If tail-biting convolution code is used, or if the set of replica nodes and the set of original nodes are ordered cyclic sets and if each replica node sends its first result to a replica node immediately succeeding the respective replica node, Step-2 may be generalized as passing the first result of each replica node to a replica node holding data $u_i+1(\bmod k)+1$, and then computing $u_i+u_i(\bmod k)+1+u_1+1(\bmod k)+1$. After the second result is generated, the replica data in each replica node may be replaced with the second result generated at the respective replica node. Step-1 and Step-2 may be pipelined, so that generating a first result at a second replica node and generating a second result at a first replica node may occur simultaneously.

The following paragraphs compare a method of encoding data, according to various embodiments, against prior art coding methods such as centralized coding and replicated redundancy system. The comparison makes a few standard assumptions. The first assumption is that all the storage nodes have a duplex connection. Without loss of generality, each node may download one unit or block of data in a unit time, and may also simultaneously upload an equivalent volume of data. The second assumption is that each node may carry out some computations, so that network coding may be feasible, and that each node may have some buffer memory to store some additional data temporarily while carrying out processing tasks. The time taken to process some smaller (with respect to the size of one block) quantum of data, say two one byte strings, may be denoted as $\delta$. The processing task referred herein may be an XOR operation, and thus $\delta \ll 1$. The time taken to transfer the smaller quantum of data may be denoted as $\tau$. The third assumption is that $\tau \ll 1$. The smaller quantum of data may be of one byte.

A method of encoding data, according to various embodiments, may distribute the coding process itself, and the distributed coding may significantly accelerate the creation of erasure coding based redundancy while also removing single points of bottlenecks.

A method of encoding according to various embodiments, may include sequential logical steps which may be carried out in a pipelined manner. In other words, the first byte or a small quantum of the data may be processed in Step-1, and then, even as the next byte is going through Step-1, Step-2 may be commenced for the earlier byte. Due to the pipelining, the total time for data transmission may be $1+\tau$, and the total time for computations may be $2\delta$. Also, the different parity blocks may be created in parallel. Thus, in general, the whole encoding process may take 1+τ+2δ time, and a transfer of 2k blocks of data.

In comparison, if the encoding was done centrally, then one node may have to collect all the five data blocks at one place. Assuming the same initial configuration, this may require four transfers and four units of time, since the downlink of the receiver may be a bottleneck. The encoding may be carried out next. Ten XOR computations may be needed, and a naive way to do it may take ten XORs computations over the whole blocks (and not the smaller computation over bytes), though smarter scheduling and reuse of partial results can lead to some reduction, for instance, a straightforward reuse of partial results leads to the need of only eight XOR operations. Finally, the encoded blocks may need to be disseminated to the other storage node, requiring four data transfers and four units of time, since the upload link may be the bottleneck during this phase. All in all, the centralized process may require transferring 2(k−1) blocks of data, and 2(k−1) amount of time for these transfers, in addition to some further time for computations. This provides a back of the envelope estimate of the baseline.

A method of encoding data, according to various embodiments, may have a higher fault-tolerance than a replicated redundancy system, as up to three arbitrary failures in the given cluster of nodes may be tolerated without risking any data loss.

In comparison, in a replicated redundancy system, data may be lost with just two failed nodes, if the failed nodes happened to be the nodes storing the replicas. In other words, to achieve the same fault-tolerance, that of against three arbitrary failures, four replicas would have had to be maintained in a replicated redundancy system. Therefore the method of encoding data proposed herein, may provide an advantage in storage cost over replication. The method of encoding data as proposed may provide up to 50% reduction in storage.

In a scenario where new data is being introduced in the system, and it is desired that the new data be stored in erasure encoded format immediately upon acquisition, if the encoding was to be done centrally, then a gateway node also referred to herein as the source, may have to send the five (k) blocks to a single node, which takes five units of time. It may be noted that even if the gateway has higher bandwidth capacity, the bottleneck may be at the receiving node. This node may then have to carry out the encoding and also distribute the blocks to the remaining nine nodes in the cluster, which takes another nine units of time. In total, to perform the encoding centrally takes fourteen units of time, or in general, (3k−1) units of time, for data transfer, in addition to the time needed for computations. It also incurred fourteen blocks, or in general, (3k−1) blocks of data transfer. While the source may directly send the other systematic pieces to relevant four nodes separately, reducing the total time to 10 units of time, or in general, 2k units of time, but that may create extra load at the source, or extra network traffic in the system.

In contrast, a method of encoding data, according to various embodiments, depending on the capacity at the gateway node, may send the five (k) blocks to five nodes in parallel, which may pipeline and create replica of each of these blocks in another mirroring node, all in all taking 1+τ units of time, and incurring ten units of data transfer (including the five units sent from the source), arriving at the configuration of FIG. 6. Thus, all in all, subject to the constraints at the source, the whole encoded data may be created in 2+2τ+2δ time, independently of the choice of k, and by incurring 4k units of data transfer. This is again a very significant improvement at the speed at which the system may be populated with erasure coded redundancy for newly arriving data, for a relatively nominal increase in network usage.

The method of encoding data, according to various embodiments, may achieve several properties for an erasure code, each of the several properties being desirable for architecting resilient distributed data stores. While prior works may achieve subsets of these properties, none of those prior works have demonstrated how all the properties may be realized together, for a single code. In practice, a system may eventually need to store the data using one particular coding scheme, and hence the system may only benefit from the properties that are satisfied by that specific code. Therefore, prior to this work, all the benefits may not be enjoyed simultaneously. The proposed method of encoding data may pave the way for building systems that may benefit with respect to all the properties mentioned above, and therein lies its commercial potential.

A method of decoding data, according to various embodiments may include providing a plurality of coded nodes. Each node of the plurality of nodes may store a code generated based on data from a plurality of data nodes. The method of decoding data may further include generating a first result based on the code stored in a coded node and data from at least one data node. For example, referring to FIG. 6, if original node 602b were to fail, a first result may be generated based on the code stored in 604a, and data from data nodes 602a and 602c, to recover the data of the failed 602b. Alternatively, the first result may also be generated based on 602c, 602d and 604b; or based on 602e, 602a and 604e.

A method of decoding data, according to various embodiments may include providing a plurality of coded nodes, each node of the plurality of nodes storing a code generated based on a plurality of data nodes. The method may further include generating a first result based on the code stored in a coded node and data from at least one data node. The method may further include generating a second result based on the code stored in a further coded node and at least one from the group consisting of the first result and at least one data node. For example, referring to FIG. 6, if original nodes 602a, 602b and 602c were to fail, a first result may be generated based on the code stored in 604d and data from data nodes 602d and 602e. The first result may include the recovered data for original node 602a, in other words $u_1$. A second result may be generated based on the code stored in a further coded node 604e, data from the first result and data from 602e. The second result may include the recovered data for original node 602b, in other words $u_2$. The data from original node 602c may be recovered based on coded node 604a, the first result and the second result; or based on coded node 604b, the second result and data from original node 602d; or based on coded node 604c, data from original node 602d and data from original node 602e.

When there is a node failure in a system using (n, k) maximum distance separable (MDS) codes, then at least k amount of information may be required to be downloaded, to re-encode and generate back the corresponding lost data. The code generated by the method of encoding data, according to various embodiments, may have repair locality, that is, a lesser amount of information (obtained by contacting lesser than k nodes) may be used to regenerate the lost information. For instance, if node $n_1$ of FIG. 7 fails, then data from $n_2$, $n_3$ and $n_6$ may be used to regenerate $n_1$, thus incurring 60% of what would have been required of a MDS code with same k.

There may be multiple ways to carry out local repair for a given failure. For instance, data from the following other set of three nodes may be used instead: $n_4$, $n_5$ and $n_9$; $n_2$, $n_5$ and $n_{10}$; $n_6$, $n_7$ and $n_4$; $n_8$, $n_9$ and $n_3$; as well as $n_7$, $n_8$ and $n_{10}$. Given the symmetry of the code, failure of any other node may also be dealt with similarly. The (k, 2k, 4) code family in general may have (for k≥5), six such local repair options for any single failure. This diversity in the ways in which the repairs may be carried out is useful from a systems perspective, since, in addition to failure of nodes, some of the other nodes may be temporarily unavailable, for instance due to network problems or overload, and having alternatives may be useful in avoiding bottlenecks. Furthermore, this is also related to the number of failures that may be simultaneously repaired locally. For instance, even if nodes $n_1$, $n_2$ and $n_3$ were to fail at the same time, the respective lost data may be regenerated in parallel, where each repair may use data from only three live nodes. For instance, $n_4$, $n_5$ and $n_9$ for $n_1$; $n_6$, $n_8$ and $n_9$ for $n_2$, and $n_4$, $n_5$ and $n_8$ for $n_3$. It may be noted that in this example, a subset of the live nodes may be used in multiple regeneration processes as there are 3 failures and only 7 live nodes remaining. In this case, there may be effects such as slower repairs, etc. It may also be noted that in this example, using a larger k may provide no particular advantage in terms of code rate, or fault-tolerance, etc. In fact, for slightly larger k values, the overall fault tolerance may be worse, in that, the chances of three simultaneous failures may increase. For very large k, if the faults are 'far apart' in terms of their positions in the underlying convolution coding, then, from fault-tolerance as well as recovery point of views, they may be treated as isolated systems altogether.

All distributed data stores may stand to benefit from the performance improvements vis-a-vis faster data insertion, or in other words, redundancy creation, and faster and bandwidth and input/output efficient repair operations, that the method of encoding data, according to various embodiments, enable.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:

1. A method of encoding data, the method comprising:
providing a set of replica nodes, wherein each replica node of the set of replica nodes stores replica data identical to original data stored in a corresponding original node of a set of original nodes;
receiving original data at each replica node of the set of replica nodes, wherein the received original data is transmitted from the corresponding original node of a different replica node of the set of replica nodes;
generating a first result at each replica node, based on the replica data stored therein and the received original data; and
generating a second result at each replica node, based on the replica data stored therein and the first result from a different replica node of the set of replica nodes; and
replacing the replica data in each replica node with the second result generated at the respective replica node, wherein the set of original nodes and the set of replica nodes store erasure coded data after the replacing of the replica data in each replica node with the second result generated at the respective replica node.

2. The method of claim 1, wherein receiving original data at each replica node comprises receiving the original data from an original node that the respective replica node is bijectively paired with.

3. The method of claim 1, wherein receiving original data at each replica node comprises receiving the original data from an original node that is immediately succeeding the corresponding original node of the respective replica node, or immediately preceding the corresponding original node of the respective replica node.

4. The method of claim 1, wherein receiving original data at each replica node comprises receiving the original data from an original node that is a fixed number of original nodes away from the corresponding original node of the respective replica node.

5. The method of claim 1, wherein generating the second result at each replica node comprises generating the second result at the respective replica node based on the replica data stored therein and the first result from a replica node that is one replica node away from the respective replica node.

6. The method of claim 1, wherein a number of the replica nodes equals a number of the original nodes.

7. The method of claim 1, wherein providing a set of replica nodes comprises replicating the original data stored in each original node of the set of original nodes.

8. The method of claim 7, wherein providing a set of replica nodes further comprises storing the replicated data in the set of replica nodes.

9. The method of claim 1, wherein at least one of generating the first result or generating the second result comprises a linear operation.

10. The method of claim 1, wherein at least one of generating the first result or generating the second result comprises performing an addition.

11. The method of claim 1, wherein at least one of generating the first result or generating the second result comprises performing an XOR logical operation.

12. The method of claim 1, wherein the set of original nodes is an ordered set having a cyclic order.

13. The method of claim 1, wherein an original node immediately succeeding a last original node of the set of original nodes is a first original node of the set of original nodes.

14. The method of claim 1, wherein an original node immediately preceding a first original node of the set of original nodes is a last original node of the set of original nodes.

15. The method of claim 1, wherein the set of replica nodes is an ordered set having a cyclic order.

16. The method of claim 1, wherein a replica node immediately succeeding a last replica node of the set of replica nodes is a first replica node of the set of replica nodes.

17. The method of claim 1, wherein a replica node immediately preceding a first replica node of the set of replica nodes is a last replica node of the set of replica nodes.

18. The method of claim 1, wherein the method is a computer-implemented method.

19. The method of claim 1, wherein encoding of data is pipelined.

20. The method of claim 19, wherein generating the first result at a second replica node of the set of replica nodes and generating the second result at a first replica node of the set of replica nodes occur simultaneously.

21. A data storage system comprising:
a set of replica nodes, wherein each replica node of the set of replica nodes stores replica data identical to original data stored in a corresponding original node of a set of original nodes;
each replica node of the set of replica nodes configured to receive original data transmitted from the corresponding original node of a different replica node;
an encoder circuit configured to generate a first result at each replica node, based on the replica data stored therein and the received original data;
wherein the encoder circuit is further configured to generate a second result at each replica node, based on the replica data stored therein and the first result from a different replica node; and
wherein the encoder circuit is further configured to replace the replica data in each replica node with the second result generated at the respective replica node, wherein the set of original nodes and the set of replica nodes store erasure coded data after the encoder circuit replaces the replica data in each replica node with the second result generated at the respective replica node.

22. A non-transitory machine readable medium having stored therein a plurality of programming instructions, which when executed by a machine, cause the machine to:
provide a set of replica nodes, wherein each replica node of the set of replica nodes stores replica data identical to original data stored in a corresponding original node of a set of original nodes;
receive original data at each replica node of the set of replica nodes, wherein the received original data is transmitted from the corresponding original node of a different replica node;
generate a first result at each replica node, based on the replica data stored therein and the received original data; and
generate a second result at each replica node, based on the replica data stored therein and the first result from a different replica node; and
replace the replica data in each replica node with the second result generated at the respective replica node, wherein the set of original nodes and the set of replica nodes store erasure coded data after the replacing of the replica data in each replica node with the second result generated at the respective replica node.

* * * * *